(12) United States Patent
Perlmutter et al.

(10) Patent No.: US 7,864,573 B2
(45) Date of Patent: Jan. 4, 2011

(54) PROGRAMMING ANALOG MEMORY CELLS FOR REDUCED VARIANCE AFTER RETENTION

(75) Inventors: Uri Perlmutter, Holon (IL); Ofir Shalvi, Ra'anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 146 days.

(21) Appl. No.: 12/390,522

(22) Filed: Feb. 23, 2009

(65) Prior Publication Data

US 2009/0213654 A1    Aug. 27, 2009

Related U.S. Application Data

(60) Provisional application No. 61/030,972, filed on Feb. 24, 2008.

(51) Int. Cl.
G11C 11/34  (2006.01)
G11C 16/04  (2006.01)
G11C 16/06  (2006.01)

(52) U.S. Cl. ............................. 365/185.03; 365/185.19; 365/185.21; 365/185.22; 365/185.24; 365/185.28

(58) Field of Classification Search ............ 365/185.03, 365/185.19, 185.24, 185.21, 185.22, 185.28
See application file for complete search history.

(56) References Cited

U.S. PATENT DOCUMENTS

| | | | |
|---|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |

(Continued)

FOREIGN PATENT DOCUMENTS

EP    0783754 B1    7/1997

(Continued)

OTHER PUBLICATIONS

Huffman, A., "Non-Volatile Memory Host Controller Interface (NVMHCI)", Specification 1.0, Apr. 14, 2008.

(Continued)

*Primary Examiner*—Ly D Pham
(74) *Attorney, Agent, or Firm*—D. Kligler I.P. Services Ltd.

(57) ABSTRACT

A method includes defining a nominal level of a physical quantity to be stored in analog memory cells for representing a given data value. The given data value is written to the cells in first and second groups of the cells, which have respective first and second programming responsiveness such that the second responsiveness is different from the first responsiveness, by applying to the cells in the first and second groups respective, different first and second patterns of programming pulses that are selected so as to cause the cells in the first and second groups to store respective levels of the physical quantity that fall respectively in first and second ranges, such that the first range is higher than and the second range is lower than the nominal level. The given data value is read from the cells at a later time.

26 Claims, 2 Drawing Sheets

U.S. PATENT DOCUMENTS

| | | |
|---|---|---|
| 4,993,029 A | 2/1991 | Galbraith et al. |
| 5,056,089 A | 10/1991 | Mehrotta et al. |
| 5,077,722 A | 12/1991 | Geist et al. |
| 5,126,808 A | 6/1992 | Montalvo et al. |
| 5,172,338 A | 12/1992 | Mehrotta et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,365,484 A | 11/1994 | Cleveland et al. |
| 5,388,064 A | 2/1995 | Khan |
| 5,416,646 A | 5/1995 | Wells et al. |
| 5,416,646 A | 5/1995 | Shirai |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,541,886 A | 7/1996 | Hasbun |
| 5,600,677 A | 2/1997 | Citta et al. |
| 5,657,332 A | 8/1997 | Auclair et al. |
| 5,675,540 A | 10/1997 | Roohparvar |
| 5,696,717 A | 12/1997 | Koh |
| 5,726,649 A | 3/1998 | Tamaru et al. |
| 5,742,752 A | 4/1998 | De Koning |
| 5,751,637 A | 5/1998 | Chen et al. |
| 5,761,402 A | 6/1998 | Kaneda et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,429 A | 2/1999 | Chen et al. |
| 5,867,429 A | 2/1999 | Chen et al. |
| 5,877,986 A | 3/1999 | Harari et al. |
| 5,901,089 A | 5/1999 | Korsh et al. |
| 5,909,449 A | 6/1999 | So et al. |
| 5,912,906 A | 6/1999 | Wu et al. |
| 5,930,167 A | 6/1999 | Lee et al. |
| 5,942,004 A | 8/1999 | Cappelletti |
| 5,991,517 A | 11/1999 | Harari et al. |
| 5,995,417 A | 11/1999 | Chen et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yong et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 5/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,643,169 B2 | 11/2003 | Rudelic et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,934,188 B2 | 8/2005 | Roohparvar |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,054,193 B1 | 5/2006 | Wong |
| 7,057,958 B2 | 6/2006 | So et al. |
| 7,065,147 B2 | 6/2006 | Ophir et al. |
| 7,068,539 B2 | 6/2006 | Guterman et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |

| Patent No. | Date | Inventor |
|---|---|---|
| 7,187,195 B2 | 3/2007 | Kim |
| 7,187,592 B2 | 3/2007 | Guterman et al. |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee |
| 7,289,344 B2 | 10/2007 | Chen |
| 7,301,807 B2 | 11/2007 | Khalid et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,397,697 B2 | 7/2008 | So et al. |
| 7,408,804 B2 | 8/2008 | Hemink et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,466,592 B2 | 12/2008 | Mitani et al. |
| 7,468,911 B2 | 12/2008 | Lutze et al. |
| 7,471,581 B2 | 12/2008 | Tran et al. |
| 7,508,710 B2 | 3/2009 | Mokhlesi |
| 7,539,062 B2 | 5/2009 | Doyle |
| 7,551,492 B2 | 6/2009 | Kim |
| 7,570,520 B2 | 8/2009 | Kamei et al. |
| 7,593,259 B2 | 9/2009 | Kim |
| 7,631,245 B2 | 12/2009 | Lasser |
| 7,633,802 B2 | 12/2009 | Mokhlesi |
| 7,660,158 B2 | 2/2010 | Aritome |
| 7,742,351 B2 | 6/2010 | Inoue et al. |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0203546 A1 | 9/2006 | Lasser |
| 2006/0218359 A1 | 9/2006 | Sanders et al. |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1* | 8/2007 | Fong et al. ............ 365/185.17 |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |

| | | | |
|---|---|---|---|
| 2008/0055993 A1 | 3/2008 | Lee | |
| 2008/0080243 A1 | 4/2008 | Edahiro et al. | |
| 2008/0082730 A1 | 4/2008 | Kim et al. | |
| 2008/0089123 A1 | 4/2008 | Chae et al. | |
| 2008/0104309 A1 | 5/2008 | Cheon et al. | |
| 2008/0104312 A1 | 5/2008 | Lasser | |
| 2008/0109590 A1 | 5/2008 | Jung et al. | |
| 2008/0115017 A1 | 5/2008 | Jacobson | |
| 2008/0123420 A1 | 5/2008 | Brandman et al. | |
| 2008/0126686 A1 | 5/2008 | Sokolov et al. | |
| 2008/0130341 A1 | 6/2008 | Shalvi et al. | |
| 2008/0148115 A1 | 6/2008 | Sokolov et al. | |
| 2008/0151667 A1* | 6/2008 | Miu et al. | 365/206 |
| 2008/0158958 A1 | 7/2008 | Sokolov et al. | |
| 2008/0181001 A1 | 7/2008 | Shalvi | |
| 2008/0198650 A1 | 8/2008 | Shalvi et al. | |
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1 | 9/2008 | Shalvi et al. | |
| 2008/0239093 A1 | 10/2008 | Easwar et al. | |
| 2008/0239812 A1 | 10/2008 | Abiko et al. | |
| 2008/0263262 A1 | 10/2008 | Sokolov et al. | |
| 2008/0282106 A1 | 11/2008 | Shalvi et al. | |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann et al. | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0142277 A1 | 6/2010 | Yang et al. | |

FOREIGN PATENT DOCUMENTS

| | | | |
|---|---|---|---|
| EP | 1434236 B1 | 6/2004 | |
| EP | 1605509 A1 | 12/2005 | |
| WO | 9610256 A1 | 4/1996 | |
| WO | 9828745 A1 | 7/1998 | |
| WO | 02100112 A1 | 12/2002 | |
| WO | 2007046084 A2 | 4/2007 | |
| WO | 2007132452 A2 | 11/2007 | |
| WO | 2007132453 A2 | 11/2007 | |
| WO | 2007132456 A2 | 11/2007 | |
| WO | 2007132457 A2 | 11/2007 | |
| WO | 2007132458 A2 | 11/2007 | |
| WO | 2007146010 A2 | 12/2007 | |
| WO | 2008026203 A2 | 3/2008 | |
| WO | 2008053472 A2 | 5/2008 | |
| WO | 2008053473 A2 | 5/2008 | |
| WO | 2008068747 A2 | 6/2008 | |
| WO | 2008077284 A1 | 7/2008 | |
| WO | 2008083131 A2 | 7/2008 | |
| WO | 2008099958 A1 | 8/2008 | |
| WO | 2008111058 A2 | 9/2008 | |
| WO | 2008124760 A2 | 10/2008 | |
| WO | 2008139441 A2 | 11/2008 | |
| WO | 2009037691 A2 | 3/2009 | |
| WO | 2009037697 A2 | 3/2009 | |
| WO | 2009050703 A2 | 4/2009 | |
| WO | 2009053961 A2 | 4/2009 | |
| WO | 2009053962 A2 | 4/2009 | |
| WO | 2009053963 A2 | 4/2009 | |
| WO | 2009063450 A2 | 5/2009 | |
| WO | 2009072100 A2 | 6/2009 | |
| WO | 2009072101 A2 | 6/2009 | |
| WO | 2009072102 A2 | 6/2009 | |
| WO | 2009072103 A2 | 6/2009 | |
| WO | 2009072104 A2 | 6/2009 | |
| WO | 2009072105 A2 | 6/2009 | |
| WO | 2009074978 A2 | 6/2009 | |
| WO | 2009074979 A2 | 6/2009 | |
| WO | 2009078006 A2 | 6/2009 | |
| WO | 2009095902 A2 | 8/2009 | |

OTHER PUBLICATIONS

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed on Jun. 24, 2010.

U.S. Appl. No. 11/949,135 Official Action dated Oct. 2, 2009.

U.S. Appl. No. 12/019,011 Official Action dated Nov. 20, 2009.

Takeuchi et al., "A Multipage Cell Architecture for High-Speed Programmin Multilevel NAND Flash Memories", IEEE Journal of Solid State Circuits, vol. 33, No. 8, Aug. 1998.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May, 1984, section 3.2, pp. 47-48.

Chang, L "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

DATALIGHT, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW' 2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

Sommer, N., U.S. Appl. No. 12/171,797 "Memory Device with Non-Uniform Programming Levels" filed on Jul. 11, 2008.

Shalvi et al., U.S. Appl. No. 12/251,471 "Compensation For Voltage Drifts In Analog Memory Cells" filed on Oct. 15, 2008.

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

U.S. Appl. No. 12/880,101 "Reuse of Host Hibernation Storage Space by Memory Controller", filed on Sep. 12, 2010.

U.S. Appl. No. 12/890,724 "Error Correction Coding Over Multiple Memory Pages", filed on Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE16: 16-Mbit, page-erasable serial flash memory with byte-alterability, 75 MHz SPI bus, standard pinout", Apr. 2008.

US 7,161,836, 01/2007, Wan et al. (withdrawn)

* cited by examiner

PROGRAMMING ANALOG MEMORY CELLS FOR REDUCED VARIANCE AFTER RETENTION

CROSS-REFERENCE TO RELATED APPLICATIONS

This application claims the benefit of U.S. Provisional Patent Application 61/030,972, filed Feb. 24, 2008, whose disclosure is incorporated herein by reference.

FIELD OF THE INVENTION

The present invention relates generally to memory devices, and particularly to methods and systems for data storage in analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

The reaction of analog memory cells to programming signals sometimes varies from one memory cell to another. Some known methods and systems program memory cells differently, depending on the cells' responsiveness to programming. For example, U.S. Pat. No. 7,177,199, whose disclosure is incorporated herein by reference, describes a process for programming a set of non-volatile memory cells, which is adapted based on behavior of the memory cells. In an example process, a set of program pulses is applied to a set of Flash memory cells. A determination is made as to which memory cells are easier to program and which memory cells are harder to program. Bit line voltages or other parameters are adjusted based on the determination. The programming process then continues with the adjusted bit line voltages or other parameters.

U.S. Pat. No. 6,166,962, whose disclosure is incorporated herein by reference, describes a circuit and method for equalizing charge-discharge characteristics of an array of Flash memory cells. A variable conditioning signal removes charge from "fast" bits in the array, and leaves other cells relatively unaffected so that the fast bits are adjusted to have threshold voltages closer to those of the other cells in an array. In this manner, the voltage thresholds are tightened and equalized.

U.S. Pat. No. 7,408,804, whose disclosure is incorporated herein by reference, describes systems for soft programming of non-volatile memory utilizing individual verification and additional soft programming of subsets of memory cells. A set of non-volatile storage elements is divided into subsets in order to more fully soft-program slower soft programming elements. The entire set of elements is soft-programmed until verified as soft programmed. After the set is verified as soft programmed, a first subset of elements is inhibited from further soft programming while additional soft programming is carried out on a second subset of elements. The second subset may include slower soft programming elements. The second subset can then undergo soft programming verification while excluding the first subset from verification. Soft programming and verifying for the second subset can continue until it is verified as soft programmed.

U.S. Pat. No. 5,751,637, whose disclosure is incorporated herein by reference, describes a programming method for page mode Flash memory with variable programming pulse height and pulse width. The method provides a pattern of program retry pulses which have respective pulse widths and pulse heights, which vary according to a pattern. The pattern includes a combination of both increasing pulse widths and increasing pulse heights. The pattern includes a first phase which completes in a specified amount of time including a predetermined number of retries so that substantially all of the cells in the array are programmed within the first phase. A second phase of the patter involves a sequence of higher-energy pulses addressed to programming the slowest cells in the array.

U.S. Pat. No. 7,139,192, whose disclosure is incorporated herein by reference, describes write operations that simultaneously program multiple memory cells on the same word line in a multi-level non-volatile memory. The write operations employ word line voltage variation, programming pulse width variation and column line voltage variation to achieve uniform programming accuracy across a range of target threshold voltages. During or at the end of write operations, remedial programming sequences can adjust the threshold voltages of memory cells that program slowly.

SUMMARY OF THE INVENTION

An embodiment of the present invention provides a method for data storage in analog memory cells, the method including:

defining a nominal level of a physical quantity to be stored in the analog memory cells for representing a given data value;

writing, at a first time, the given data value to the analog memory cells in first and second groups of the analog memory cells, which have respective first and second programming responsiveness such that the second programming responsiveness is different from the first programming responsiveness, by applying to the analog memory cells in the first and second groups respective, different first and second patterns of programming pulses that are selected so as to cause the analog memory cells in the first and second groups to store respective levels of the physical quantity that fall respectively in first and second ranges of the levels, such that the first range is higher than the nominal level and the second range is lower than the nominal level; and at a second time, subsequent to the first time, reading the given data value from the analog memory cells in the first and second groups.

In an embodiment, the second programming responsiveness is lower than the first programming responsiveness. In another embodiment, the second programming responsiveness is higher than the first programming responsiveness. In some embodiments, the analog memory cells include Flash memory cells and the physical quantity includes electrical charge. In an embodiment, the nominal level is one of multiple nominal levels of the physical quantity that represent respective multiple data values to be stored in the analog memory cells, and reading the given data value includes sensing the levels of the physical quantity stored in the analog memory cells in the first and second groups, and comparing the sensed levels to one or more read thresholds.

In an embodiment, applying the first and second patterns includes:

defining a verification threshold;

applying a given number of the programming pulses to the analog memory cells; and after applying the given number, lowering the verification threshold and continuing to apply the programming pulses selectively to only the analog memory cells having the levels of the physical quantity that are lower than the verification threshold.

In a disclosed embodiment, applying the first and second patterns includes:

defining a verification threshold;

applying the programming pulses to the analog memory cells in both the first and the second groups until a predefined portion of the levels of the physical quantity in the analog memory cells exceeds the verification threshold; and after the predefined portion exceeds the verification threshold, continuing to apply the programming pulses selectively to only the analog memory cells having the levels of the physical quantity that are lower than the verification threshold.

Applying the programming pulses may include determining that the predefined portion exceeds the verification threshold by comparing the levels in the analog memory cells to the verification threshold and counting the levels that exceed the verification threshold. Alternatively, applying the programming pulses may include estimating a number of the programming pulses that are expected to cause the predefined portion of the levels to exceed the verification threshold, and applying the estimated number of the programming pulses. Applying the programming pulses sometimes includes lowering the verification threshold after the predefined portion exceeds the verification threshold.

In an embodiment, continuing to apply the programming pulses includes applying the programming pulses only until another predefined portion of the levels exceeds the verification threshold. Continuing to apply the programming pulses may include determining that the other predefined portion exceeds the verification threshold by comparing the levels in the analog memory cells to the verification threshold and counting the levels that exceed the verification threshold. Alternatively, continuing to apply the programming pulses may include estimating a number of additional programming pulses that are expected to cause the other predefined portion of the levels to exceed the verification threshold, and applying the estimated number of the additional programming pulses.

There is additionally provided, in accordance with an embodiment of the present invention, a data storage apparatus, including:

a plurality of analog memory cells; and

Reading/Writing (R/W) circuitry, which is coupled to the analog memory cells and is configured to define a nominal level of a physical quantity to be stored in the analog memory cells for representing a given data value, to write, at a first time, the given data value to the analog memory cells in first and second groups of the analog memory cells, which have respective first and second programming responsiveness such that the second programming responsiveness is different from the first programming responsiveness, by applying to the analog memory cells in the first and second groups respective, different first and second patterns of programming pulses that are selected so as to cause the analog memory cells in the first and second groups to store respective levels of the physical quantity that fall respectively in first and second ranges of the levels, such that the first range is higher than the nominal level and the second range is lower than the nominal level, and, at a second time subsequent to the first time, to read the given data value from the analog memory cells in the first and second groups.

The present invention will be more fully understood from the following detailed description of the embodiments thereof, taken together with the drawings in which:

DETAILED DESCRIPTION OF EMBODIMENTS

Overview

Analog memory cells typically hold certain levels of a physical quantity (e.g., electrical charge), which represent the data stored in the cells. Multiple programming states are typically defined, such that each programming state represents a certain stored data value and corresponds to a certain nominal level of the physical quantity. Analog memory cells are typically programmed by applying programming pulses to the cells in order to cause the cells to accumulate the desired level of the physical quantity.

In practice, however, the actual levels of the physical quantity stored in the memory cells tend to deviate from the nominal levels for various reasons. Within a group of cells that are programmed to store a given data value, the actual levels of the physical quantity are typically distributed in accordance with a certain statistical distribution around the nominal level. In order to read data reliably from the memory cells, it is important to keep these distributions as narrow as possible. (The distribution of the physical quantity levels in a group of cells that are programmed to a given programming state is referred to herein as a "programming state distribution" for brevity.)

Embodiments of the present invention that are described hereinbelow provide improved methods and systems for programming analog memory cells. The methods and systems described herein pre-shape the programming state distributions, such that the distributions may initially be relatively wide but become narrow after a certain retention period due to aging effects. The disclosed techniques are in sharp contrast to known programming methods, which attempt to create compact distributions at the time of programming without regard to changes in the distributions that will occur by the time the cells are actually read.

In many cases, the width of a programming state distribution can be attributed to cell-to-cell differences in responsiveness to programming pulses, as well as to differences in aging-related drift of the physical quantity levels over time. It has been observed that the two effects are often correlated. One of the possible reasons for this correlation is that the presence of traps in the memory cell increases both its responsiveness to programming pulses and the aging-related drift In other words, memory cells that are highly responsive to programming tend to exhibit high drift over time, whereas the physical quantity levels of memory cells having low responsiveness to programming typically drift more slowly. Furthermore, memory cells that are highly responsive to programming pulses tend to suffer from more disturbs, since they are also highly responsive to non-intentional programming caused by reading or programming other cells. Moreover, highly-responsive memory cells are often more susceptible to over-programming problems, since they are more likely to be programmed far beyond their target levels.

The disclosed methods and systems use the above-mentioned correlation. Within a group of memory cells that are programmed to a given programming state, which is associated with a certain nominal level of the physical quantity, the methods and systems described herein apply different respective patterns of programming pulses to high-responsiveness cells and to low-responsiveness cells. In some embodiments, the differing programming patterns cause high-responsiveness cells to reach physical quantity levels that are above the nominal level, and low-responsiveness cells to reach physical quantity levels that are below the nominal level.

Since aging-related drift acts in the opposite direction (i.e., high-responsiveness cells decrease their physical quantity level faster than low-responsiveness cells), the programming state distribution becomes narrow and compact after a certain retention period. When multiple programming state distributions are produced in this manner, the different distributions become better separated over time and can be easily distinguished from one another after the retention period. As a result, the memory cells can be read with low error probability. Several programming schemes and programming pulse patterns for achieving such pre-shaped distributions are described herein.

In alternative embodiments, the differing programming patterns are selected so as to cause high-responsiveness cells to reach physical quantity levels that are below the nominal level, and low-responsiveness cells to reach physical quantity levels that are above the nominal level. Such patterns can be useful, for example, for reducing over-programming in Multi-Level Cells (MLC).

System Description

Figure 1:
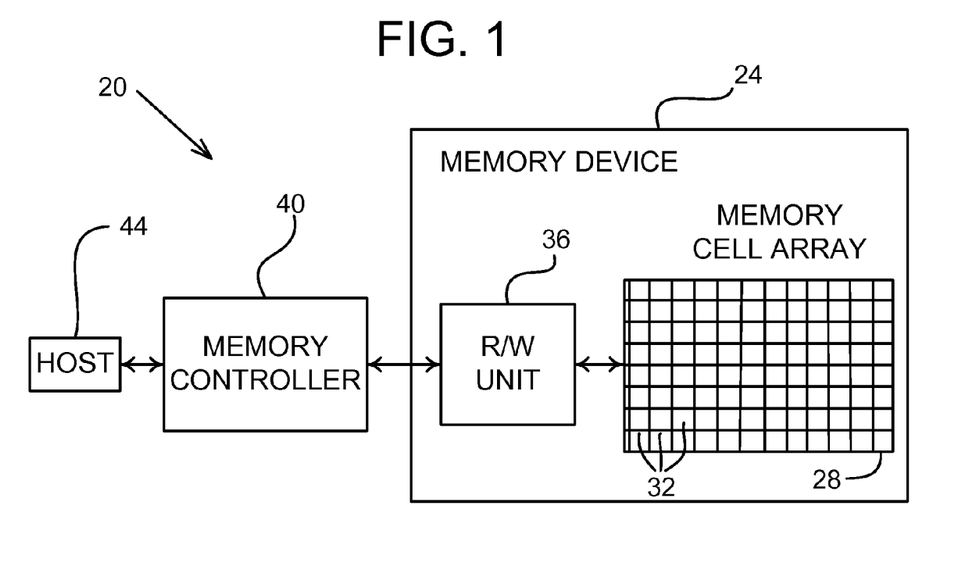
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog level of a physical quantity, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming states are selected from a finite set of possible states, and each state corresponds to a certain nominal storage value. For example, a 2 bit/cell MLC can be programmed to assume one of four possible programming states by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. The R/W unit typically reads data from cells 32 by comparing the storage values of the cells to one or more read thresholds. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. In some embodiments, controller 40 produces the storage values for storing in the memory cells and provides these values to R/W unit 36. Alternatively, controller 40 may provide the data for storage, and the conversion to storage values is carried out by the R/W unit internally to the memory device.

Memory controller 40 communicates with a host 44, for accepting data for storage in the memory device and for outputting data retrieved from the memory device. In some embodiments, some or even all of the functions of controller 40 may be implemented in hardware. Alternatively, controller 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the circuitry of the memory controller may reside on the same die on which the memory array is disposed. Further alternatively, some or all of the functionality of controller 40 can be implemented in software and carried out by a processor or other element of the host system. In some implementations, a single memory controller may be connected to multiple memory devices 24. In yet another embodiment, some or all of the memory controller functionality may be carried out by a separate unit, referred to as a memory extension, which acts as a slave of memory device 24. Typically, controller 40 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks. In some embodiments, a given memory devices comprises multiple memory cell arrays, which may be fabricated on separate dies.

Storage Value Distributions and Their Effect on Storage Reliability

As noted above, data is stored in analog memory cells 32 by programming the cells to assume certain levels of a given physical quantity (e.g., electrical charge), which correspond to respective storage values (e.g., threshold voltages). For example, in a group of four-level (2 bits/cell) Flash memory cells, the data values "11", "10", "00" and "01" can be represented by threshold voltages −1V, 1V, 3V and 5V, respectively. The four nominal threshold voltage levels and corresponding data values are referred to as programming states of the memory cells. The description that follows refers mainly to Flash cells whose charge levels (or threshold voltages) represent stored data. Alternatively, however, the methods and systems described herein can be used with various other sorts of analog memory cells that hold various other kinds of physical quantities and storage values.

R/W unit 36 programs memory cells 32 by applying programming pulses (e.g., voltage pulses) to the cells. For example, when cells 32 comprise floating-gate Flash cells, the R/W unit applies programming pulses to the gates of the cells. In a typical Flash device configuration, the gates of multiple cells are connected to a common word line, and the R/W unit is able to program multiple cells in parallel by applying programming pulses to the word line. A given programming pulse causes a given memory cell to accumulate a given electrical charge, which corresponds to a certain threshold voltage.

In practice, however, when R/W unit 36 programs a given memory cell to a certain programming state, the actual threshold voltage assumed by the cell often varies somewhat from the nominal storage value that represents the intended programming state. These variations may be due to different reasons, such as various inaccuracies in the programming process, aging effects and/or differences in cell properties from one cell to another. Thus, when a group of memory cells is programmed to a certain programming state (i.e., when the same given data value is written to a group of cells), the actual storage values of the cells in the group are typically distributed in accordance with a certain statistical distribution. This distribution is referred to herein as the "programming state distribution." Several such distributions are shown, for example, in FIG. 2 below.

The variance of the programming state distributions has a considerable detrimental effect on the storage reliability of the memory cells, i.e., on the probability of read errors. As noted above, reading data from the memory cells is typically performed by comparing their storage values to one or more read thresholds, attempting to associate the read storage values to the programming states correctly. When the distributions are wide, the likelihood of storage values to fall on the wrong side of a read threshold increases. This effect is particularly severe in multi-level memory cells, in which the separation between adjacent programming states is relatively small.

Programming Analog Memory Cells to Achieve Compact Programming State Distributions After Retention In many practical cases, the shape of a given programming state distribution is dominated by two effects: (1) cell-to-cell differences in the responsiveness of the cells to programming, and (2) cell-to-cell differences in aging effects that vary the cells' storage values after programming.

The term "responsiveness to programming" is used to describe the extent to which a given memory cell reacts to a given programming pulse in assuming its intended physical quantity level or storage value. When a programming pulse having a given amplitude is applied to multiple memory cells, some cells (referred to as low-responsiveness cells) may accumulate less charge and assume a lower threshold voltage, while other cells (referred to as high-responsiveness cells) may accumulate more charge and assume a higher threshold voltage. In other words, responsiveness to programming is a relative measure, which compares the physical quantities or storage values assumed by different cells or groups of cells in response to a certain programming pulse or pulses.

Aging effects cause the physical quantities stored the cells, and thus the storage values of then cells, to vary with time after the cells have been programmed. For example, in Flash memory cells, the electrical charge of the memory cells tends to decrease over time, causing the threshold voltages of the cells to decrease accordingly. Thus, a given programming state distribution typically drifts, such that its mean typically decreases over time. The amount of drift depends on the retention period, i.e., the time period between the time the cells have been programmed and the time the cells are read. In many practical cases, the rate of aging-related drift varies from cell to cell. Therefore, the shape (and in particular, the variance) of the programming state distribution often changes over time, as well.

It can be shown that a correlation exists between responsiveness to programming and aging-related drift. Typically, memory cells that are highly responsive to programming will exhibit high drift with retention. The storage values of memory cells having low responsiveness to programming will typically drift more slowly.

In floating-gate memory cells, for example, the correlation between programming responsiveness and retention can be explained, at least partially, by the fact that both properties are affected by the isolation of the cells' floating gates. Within a given memory cell array, the isolation often varies from one cell to another. Memory cells having high isolation will typically be slower and less responsive to program, since it is more difficult to overcome the high isolation and insert electrical charge to their gates. Cells having low isolation will typically be faster and more responsive to programming, since the isolation that has to be overcome is smaller. The retention of a given memory cell depends, at least partially, on the leakage of electrical charge from the cell's gate to the substrate, which lowers the threshold voltage of the cell. Charge leakage is typically lower in cells having high isolation, and vice versa.

Embodiments of the present invention provide improved methods and systems for programming analog memory cells, which use the above-mentioned correlation between responsiveness to programming and aging-related drift. Within the memory cells programmed to a given programming state, the methods and systems described herein apply different patterns of programming pulses to high-responsiveness cells and to low-responsiveness cells. The differing programming patterns shape the programming state distribution, such that subsequent aging effects cause the distribution to become compact after a certain retention period.

(The description that follows refers to programming pulses that cause the memory cells to assume certain storage values or produce a certain distribution of storage values. References to storage values and to levels of physical quantities are made interchangeably, since the storage values are indicative of the levels of the physical quantity stored in the cells. In other words, the reference to storage values is made for the sake of brevity and clarity. The programming pulses can be equivalently viewed as causing the memory cells to store certain levels of the physical quantity (e.g., electrical charge) or to produce a certain distribution of the physical quantity levels. The term "programming state distribution" can thus refer to physical quantity levels as well as to storage values.)

Figure 2:
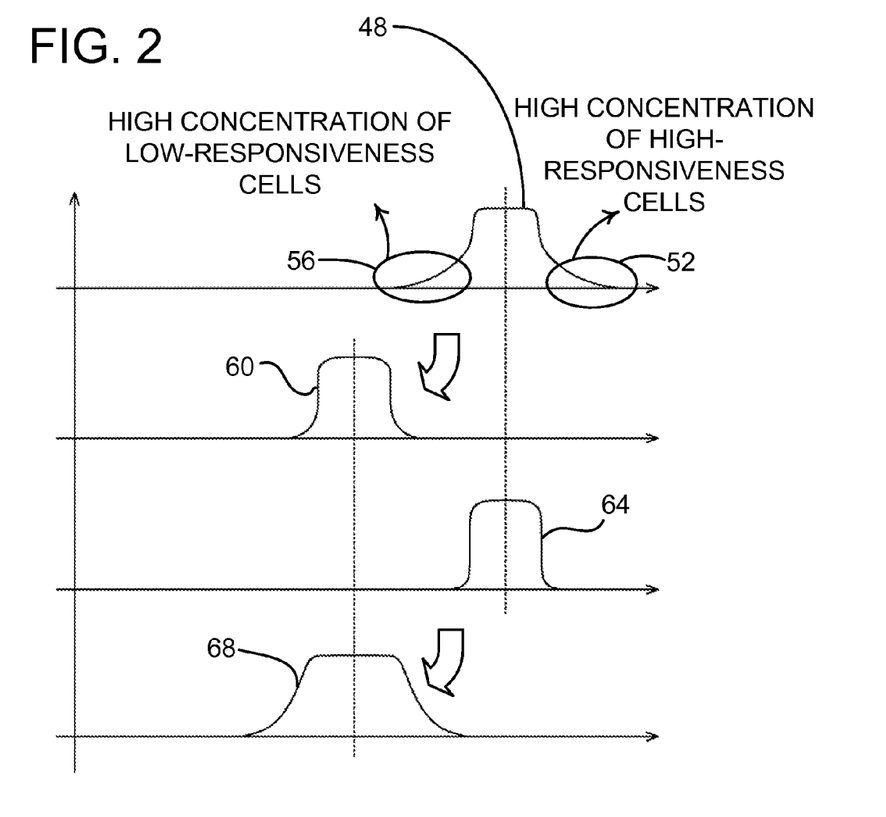
FIG. 2 is a graph showing storage value distributions in a group of analog memory cells, in accordance with an embodiment of the present invention.

FIG. 2 is a graph showing programming state distributions in a group of analog memory cells, in accordance with an embodiment of the present invention. Throughout FIG. 2, the horizontal axis shows the storage value (e.g., threshold voltage), and the vertical axis shows the number of cells having each storage value. All of the memory cells in the group are programmed to store the same data value, i.e., programmed to the same programming state. For example, when a set of N-level memory cells is programmed with equi-probable data, approximately 1/N of the cells are programmed to each programming state. The distributions shown in FIG. 2 may correspond to any such group of cells.

Plots 48 and 60 show the programming state distributions in a group of cells that are programmed to a given programming state, when the cells are programmed using the disclosed methods. Plot 48 shows the distribution immediately after programming. Plot 60 shows the distribution after a certain retention period, e.g., after several weeks, months or even years.

Reference is first made to plot 48, which shows the distribution immediately after programming. R/W unit 36 programs the memory cells such that (1) high-responsiveness cells are concentrated in a range 52 of storage values, and (2) low-responsiveness cells are concentrated in a range 56 of storage values. The nominal storage value associated with the given programming state falls approximately in the middle of the distribution, so that range 52 is higher than the nominal storage value and range 56 is lower than the nominal storage value. R/W unit may produce a distribution of this sort by applying different patterns of programming pulses to high-responsiveness and to low-responsiveness cells. An example programming scheme that can be used for this purpose is described in FIG. 3 below.

As noted above, the storage values of high-responsiveness cells tend to drift at a higher rate due to aging, in comparison with low-responsiveness cells. In particular, the storage values falling in range 52 will typically decrease more rapidly over time than the storage values in range 56. Thus, after a certain retention period, the programming state distribution becomes compact. Plot 60 shows the programming state distribution after a certain retention period. As can be appreciated from comparing plots 48 and 60, the distribution after the retention period is considerably more compact than the distribution immediately after programming. This compaction effect is due to the fact that the high-responsiveness cells, which have higher drift rates, were initially programmed to higher storage values than low-responsiveness cells having lower drift rates.

Plots 64 and 68 show the programming state distributions in a similar group of cells, which are programmed without applying different programming to high- and low-responsiveness cells, for comparison purposes. Plot 64 shows the distribution immediately after programming, and plot 68 shows the distribution after the same retention period as plot 60. The two sets of plots demonstrate that, although the disclosed methods produce a relatively wide distribution immediately after programming (plot 48 vs. 64), the distribution after a certain retention period is considerably more compact than using known methods (plot 60 vs. 68).

Figure 3:
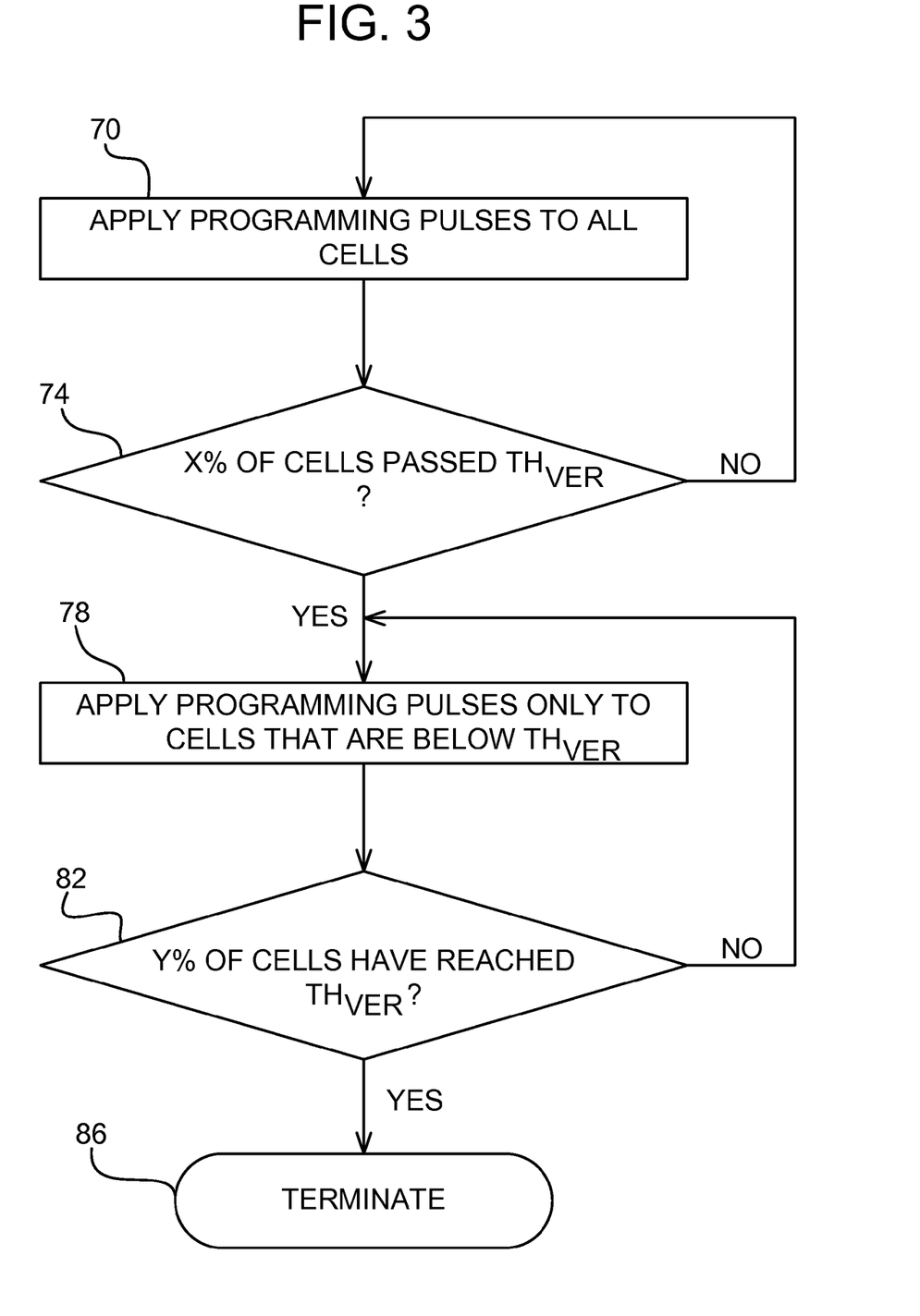
FIG. 3 is a flow chart that schematically illustrates a method for programming analog memory cells, in accordance with an embodiment of the present invention.

FIG. 3 is a flow chart that schematically illustrates a method for programming analog memory cells, in accordance with an embodiment of the present invention. In the method of FIG. 3, R/W unit 36 programs a group of memory cells to a given programming state by applying to the cells a sequence of programming pulses that gradually increase in amplitude. R/W unit 36 applies different programming patterns to high- and low-responsiveness cells in the group by conditionally stopping to apply the pulse sequence to certain cells, as will be described below.

The method begins with R/W unit 36 applying the sequence of programming pulses to all the cells in the group, at an initial programming step 70. The R/W unit checks whether a certain percentage of the cells (denoted X %) have passed a certain verification threshold denoted $TH_{VER}$, at a first checking step 74. The R/W unit may measure the percentage of cells that passed $TH_{VER}$ by reading the storage values of the cells using a read threshold set to $TH_{VER}$, and counting the number of read storage values that exceed the read threshold. As long as less than X % of the cells have passed $TH_{VER}$, the method loops back to step 70 above, and the R/W unit continues to apply programming pulses to all the cells in the group.

Referring to FIG. 2 above, R/W unit 36 can control the size of range 52 in plot 48 by choosing the appropriate value of X. In a typical implementation, X may be set to values on the order of 5-10%, although any other suitable values can also be used.

When more than X % of the cells have passed $TH_{VER}$, R/W unit 36 begins to apply programming pulses selectively, only to the memory cells whose storage values have not yet reached $TH_{VER}$, at a selective programming step 78. The R/W unit checks whether Y % of the cells have exceeded $TH_{VER}$, at a second checking step 82. As long as less than Y % of the cells have reached $TH_{VER}$, the method loops back to step 78 above and programming continues. When the number of cells whose storage values have reached $TH_{VER}$ exceeds Y %, R/W unit 36 stops the programming sequence, and the method terminates, at a termination step 86. By choosing the value of Y, R/W unit 36 can control the size of range 56 in FIG. 2 above. In a typical implementation, Y may be set to values on the order of 90-95%, although any other suitable values can also be used.

Typically although not necessarily, the R/W unit lowers the value of $TH_{VER}$ between steps 74 and 78. In other words, the R/W unit may allow X % of the cells to exceed a certain verification threshold, and stop the sequence when Y % of the cells reach a somewhat lower verification threshold. This threshold change further differentiates between the high- and low-responsiveness cells (i.e., between ranges 52 and 56).

Using the method of FIG. 3, the R/W unit causes high-responsiveness cells to concentrate in range 52 by continuing to apply programming pulses to the all the cells, even though some of the cells have already reached the designated verification threshold $TH_{VER}$. Since high-responsiveness cells are more likely to exceed $TH_{VER}$ after fewer programming pulses, the X % of the cells that are permitted to exceed $TH_{VER}$ and reach range 52 will typically comprise a high concentration of high-responsiveness cells.

At the other extreme of the programming state distribution, the R/W unit causes low-responsiveness cells to concentrate in range 56 by stopping the programming sequence before all cells have reached the designated verification threshold $TH_{VER}$. Since low-responsiveness cells are less likely to reach $TH_{VER}$ after a certain number of programming pulses, the (100−Y) % of the cells that remain in range 56 when the sequence is terminated will typically comprise a high concentration of low-responsiveness cells.

Following the process of FIG. 3, the storage values of the memory cells have a distribution that resembles plot 48 in FIG. 2 above. At a later time, after a certain retention period, R/W unit 36 is instructed by memory controller 40 to read the cells. Since the storage value distribution is compact, the cells can be read with a relatively small probability of error.

In an alternative embodiment, the R/W unit may program a certain portion of the cells (50% in the present example) using a certain $TH_{VER}$ value. When 50% of the cells exceed $TH_{VER}$, the R/W unit reduces $TH_{VER}$ to a lower value, and then programs the remaining 50% of the cells using the lower $TH_{VER}$. This process also creates a storage value distribution that differentiates between high- and low-responsiveness cells and resembles plot 48 in FIG. 2 above.

The description of FIG. 3 focuses on a group of cells that are programmed to a given programming state. In system 20, data is typically stored in cells 32 by programming different cell groups to different programming states. In some embodiments, the process of FIG. 3 is applied to each of these cell groups, so that the distribution of each programming state becomes compact after the retention period. As such, the different programming states are better separated and better distinguished from one another. When the cells are read, e.g., by comparing their storage values to one or more read thresholds, the probability of read errors is reduced considerably.

When memory cells 32 store data in multiple programming levels, the different cells may be programmed to their intended programming levels in a single sweep of the storage value range. Programming of each cell is performed using an appropriate value of $TH_{VER}$, which differ between cells that are to be programmed to different programming levels. In these embodiments, the method of FIG. 3 can be applied separately to the cells associated with each programming level, by using the $TH_{VER}$ value that is appropriate for that programming level, and by determining the number of cells that have exceeded $TH_{VER}$ within each programming level.

In some embodiments, R/W unit 36 determines the number of cells that have exceeded $TH_{VER}$ (or the number of cells that have not yet reached $TH_{VER}$) by performing a read operation with a read threshold that is set to the value of $TH_{VER}$, and then counting the number of read storage values that are above or below the threshold. This counting operation may be carried out using suitable counters in R/W unit 36.

In alternative embodiments, however, the method of FIG. 3 can be carried out without explicitly counting the number of cells that have reached $TH_{VER}$. For example, the typical number of programming pulses that are needed in order to cause X % of the cells to exceed $TH_{VER}$ can be estimated a-priori, by performing measurements on a number of memory devices. The typical number of programming pulses after which Y % of the cells remain below $TH_{VER}$ can be estimated using similar measurements. The R/W unit can apply a certain fixed number of pulses to all cells, and then continue with applying a certain fixed number of pulses only to cells that are below $TH_{VER}$, wherein the fixed number of pulses in each stage is determined by the a-priori measurements. This technique enables eliminating the counters in R/W unit 36, as well as reduces the number of read operations and thus improves programming speed. A similar a-priori estimation process can also be used when applying the above-mentioned technique of lowering $TH_{VER}$ after 50% of the cells have been programmed. In other words, the typical number of programming pulses, which are needed to cause 50% of the cells to exceed $TH_{VER}$, can be estimated a-priori. During programming, the R/W unit applies this number of pulses, and then lowers $TH_{VER}$ and continues programming.

The programming process of FIG. 3 is shown by way of example. In alternative embodiments, R/W unit 36 may apply different programming patterns to high- and low-responsiveness cells in any other way, in order to concentrate the storage values of high-responsiveness cells above the nominal storage value and the storage values of low-responsiveness cells below the nominal storage value.

For example, the R/W unit may program the memory cells using an iterative Program and Verify (P&V) process, in which a sequence of programming pulses that gradually increase in magnitude is applied to the memory cells. The storage values of the memory cells are read after each programming iteration, and the read values are verified by comparing them to one or more verification thresholds. Programming is continued for only the memory cells whose storage values have not yet exceeded the appropriate verification thresholds. In some embodiments, e.g., in MLC devices, multiple verification thresholds are defined for the respective programming states. In these embodiments, the R/W unit may use a certain set of verification thresholds for the low-responsiveness cells, and a different set of verification thresholds for the high-responsiveness cells. The two sets may differ only partially, i.e., some of the verification thresholds may be the same in both sets. A given verification threshold, which is used for programming the low-responsiveness cells and is associated with a given programming state, may be higher or lower than the verification threshold that corresponds to the same programming state and is used for programming the high-responsiveness cells.

Note that in some of the methods described herein, the R/W unit does not necessarily need to classify the cells into high- and low-responsiveness cells explicitly in order to apply the different programming patterns.

The embodiments described above refer mainly to programming patterns that cause high-responsiveness cells to reach physical quantity levels that are above the nominal level, and low-responsiveness cells to reach physical quantity levels that are below the nominal level. Generally, however, the methods and systems described herein may use programming patterns, which cause cells having a certain responsiveness to reach physical quantity levels that are above the nominal level, and cells having a different responsiveness to reach physical quantity levels that are below the nominal level.

In particular, in some embodiments the programming patterns are chosen so as to cause high-responsiveness cells to reach physical quantity levels that are below the nominal level, and low-responsiveness cells to reach physical quantity levels that are above the nominal level. Such programming patterns can be effective, for reducing the likelihood of over-programming problems.

Consider, for example, a NAND Flash memory having an erased state and N-1 programming states. In some embodiments, the lowest N-2 programming states are programmed using the above-mentioned patterns, i.e., such that high-responsiveness cells are programmed to charge levels above the nominal level and low-responsiveness cells are programmed to charge levels below the nominal level. The highest ((N-1)$^{th}$) programming state, on the other hand, is programmed such that high-responsiveness cells are programmed to charge levels below the nominal level and low-responsiveness cells are programmed to charge levels above the nominal level. This sort of programming can improve the separation between programming states without increasing the risk of over-programming, since low-responsiveness cells are less likely to cause over-programming.

Although the embodiments described herein mainly address programming memory cells of solid state memory devices, the principles of the present invention can also be used for other applications, for example for data storage in magnetic media such as Hard Disk Drives (HDDs).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage in analog memory cells, the method comprising:

defining a nominal level of a physical quantity to be stored in the analog memory cells for representing a given data value;

writing, at a first time, the given data value to the analog memory cells in first and second groups of the analog memory cells, which have respective first and second programming responsiveness such that the second programming responsiveness is different from the first programming responsiveness, by applying to the analog memory cells in the first and second groups respective, different first and second patterns of programming pulses that are selected so as to cause the analog memory cells in the first and second groups to store respective levels of the physical quantity that fall respectively in first and second ranges of the levels, such that the first range is higher than the nominal level and the second range is lower than the nominal level; and at a second time, subsequent to the first time, reading the given data value from the analog memory cells in the first and second groups.

2. The method according to claim 1, wherein the second programming responsiveness is lower than the first programming responsiveness.

3. The method according to claim 1, wherein the second programming responsiveness is higher than the first programming responsiveness.

4. The method according to claim 1, wherein the analog memory cells comprise Flash memory cells, and wherein the physical quantity comprises electrical charge.

5. The method according to claim 1, wherein the nominal level comprises one of multiple nominal levels of the physical quantity that represent respective multiple data values to be stored in the analog memory cells, and wherein reading the given data value comprises sensing the levels of the physical quantity stored in the analog memory cells in the first and second groups, and comparing the sensed levels to one or more read thresholds.

6. The method according to claim 1, wherein applying the first and second patterns comprises:

defining a verification threshold;

applying a given number of the programming pulses to the analog memory cells; and after applying the given number, lowering the verification threshold and continuing to apply the programming pulses selectively to only the analog memory cells having the levels of the physical quantity that are lower than the verification threshold.

7. The method according to claim 1, wherein applying the first and second patterns comprises:

defining a verification threshold;

applying the programming pulses to the analog memory cells in both the first and the second groups until a predefined portion of the levels of the physical quantity in the analog memory cells exceeds the verification threshold; and after the predefined portion exceeds the verification threshold, continuing to apply the programming pulses selectively to only the analog memory cells having the levels of the physical quantity that are lower than the verification threshold.

8. The method according to claim 7, wherein applying the programming pulses comprises determining that the predefined portion exceeds the verification threshold by comparing the levels in the analog memory cells to the verification threshold and counting the levels that exceed the verification threshold.

9. The method according to claim 7, wherein applying the programming pulses comprises estimating a number of the programming pulses that are expected to cause the predefined portion of the levels to exceed the verification threshold, and applying the estimated number of the programming pulses.

10. The method according to claim 7, wherein applying the programming pulses comprises lowering the verification threshold after the predefined portion exceeds the verification threshold.

11. The method according to claim 7, wherein continuing to apply the programming pulses comprises applying the programming pulses only until another predefined portion of the levels exceeds the verification threshold.

12. The method according to claim 11, wherein continuing to apply the programming pulses comprises determining that the other predefined portion exceeds the verification threshold by comparing the levels in the analog memory cells to the verification threshold and counting the levels that exceed the verification threshold.

13. The method according to claim 11, wherein continuing to apply the programming pulses comprises estimating a number of additional programming pulses that are expected to cause the other predefined portion of the levels to exceed the verification threshold, and applying the estimated number of the additional programming pulses.

14. A data storage apparatus, comprising:

a plurality of analog memory cells; and

Reading/Writing (R/W) circuitry, which is coupled to the analog memory cells and is configured to define a nominal level of a physical quantity to be stored in the analog memory cells for representing a given data value, to write, at a first time, the given data value to the analog memory cells in first and second groups of the analog memory cells, which have respective first and second programming responsiveness such that the second programming responsiveness is different from the first programming responsiveness, by applying to the analog memory cells in the first and second groups respective, different first and second patterns of programming pulses that are selected so as to cause the analog memory cells in the first and second groups to store respective levels of the physical quantity that fall respectively in first and second ranges of the levels, such that the first range is higher than the nominal level and the second range is lower than the nominal level, and, at a second time subsequent to the first time, to read the given data value from the analog memory cells in the first and second groups.

15. The apparatus according to claim 14, wherein the second programming responsiveness is lower than the first programming responsiveness.

16. The apparatus according to claim 14, wherein the second programming responsiveness is higher than the first programming responsiveness.

17. The apparatus according to claim 14, wherein the analog memory cells comprise Flash memory cells, and wherein the physical quantity comprises electrical charge.

18. The apparatus according to claim 14, wherein the nominal level comprises one of multiple nominal levels of the physical quantity that represent respective multiple data values to be stored in the analog memory cells, and wherein the R/W circuitry is configured to read the given data value by sensing the levels of the physical quantity stored in the analog memory cells in the first and second groups and comparing the sensed levels to one or more read thresholds.

19. The apparatus according to claim 14, wherein the R/W circuitry is configured to define a verification threshold, to apply a given number of the programming pulses to the analog memory cells, and, after applying the given number, to lower the verification threshold and to continue to apply the programming pulses selectively to only the analog memory cells having the levels of the physical quantity that are lower than the verification threshold.

20. The apparatus according to claim 14, wherein the R/W circuitry is configured to define a verification threshold, to apply the programming pulses to the analog memory cells in both the first and the second groups until a predefined portion of the levels of the physical quantity in the analog memory cells exceeds the verification threshold, and, after the predefined portion exceeds the verification threshold, to continue to apply the programming pulses selectively to only the analog memory cells having the levels of the physical quantity that are lower than the verification threshold.

21. The apparatus according to claim 20, wherein the R/W circuitry is configured to compare the levels in the analog memory cells to the verification threshold and to count the levels that exceed the verification threshold, so as to determine that the predefined portion exceeds the verification threshold.

22. The apparatus according to claim 20, wherein the R/W circuitry is configured to accept an estimate of a number of the programming pulses that are expected to cause the predefined portion of the levels to exceed the verification threshold, and to continue to apply the programming pulses selectively after applying the estimated number of the programming pulses to the memory cells.

23. The apparatus according to claim 20, wherein the R/W circuitry is configured to lower the verification threshold after the predefined portion exceeds the verification threshold.

24. The apparatus according to claim 20, wherein the R/W circuitry is configured to continue to apply the programming pulses selectively only until another predefined portion of the levels exceeds the verification threshold.

25. The apparatus according to claim 24, wherein the R/W circuitry is configured to compare the levels in the analog memory cells to the verification threshold and to count the levels that exceed the verification threshold, so as to determine that the other predefined portion exceeds the verification threshold.

26. The apparatus according to claim 24, wherein the R/W circuitry is configured to accept an estimate of a number of additional programming pulses that are expected to cause the other predefined portion of the levels to exceed the verification threshold, and to apply selectively the estimated number of the additional programming pulses.

* * * * *